(12) United States Patent
Singh et al.

(10) Patent No.: US 9,285,424 B2
(45) Date of Patent: Mar. 15, 2016

(54) METHOD AND SYSTEM FOR LOGIC BUILT-IN SELF-TEST

(71) Applicants: Nitin Singh, New Delhi (IN); Amit Jindal, Sonipat (IN); Anurag Jindal, Patiala (IN)

(72) Inventors: Nitin Singh, New Delhi (IN); Amit Jindal, Sonipat (IN); Anurag Jindal, Patiala (IN)

(73) Assignee: FREESCALE SEMICONDUCTOR,INC., Austin, TX (US)

( * ) Notice: Subject to any disclaimer, the term of this patent is extended or adjusted under 35 U.S.C. 154(b) by 129 days.

(21) Appl. No.: 14/340,577

(22) Filed: Jul. 25, 2014

(65) Prior Publication Data

US 2016/0025808 A1    Jan. 28, 2016

(51) Int. Cl.
  *G01R 31/317*  (2006.01)
  *G01R 31/3185*  (2006.01)
  *G01R 31/3177*  (2006.01)

(52) U.S. Cl.
  CPC .................................. *G01R 31/3177* (2013.01)

(58) Field of Classification Search
  CPC ................... G01R 31/3004; G01R 31/318536; G01R 31/318555; G01R 31/3177
  USPC ................. 714/726, 729, 30, 724; 326/28, 14; 324/76.11
  See application file for complete search history.

(56) References Cited

U.S. PATENT DOCUMENTS

| | | | |
|---|---|---|---|
| 6,535,424 B2 * | 3/2003 | Le | G11C 16/08 365/185.18 |
| 6,809,606 B2 | 10/2004 | Wong et al. | |
| 7,266,745 B2 | 9/2007 | Kiryu | |
| 7,376,875 B2 | 5/2008 | Hilgendorf et al. | |
| 7,444,568 B2 | 10/2008 | Morrison et al. | |
| 7,519,889 B1 | 4/2009 | Cervantes et al. | |
| 7,599,808 B2 | 10/2009 | Weekly | |
| 8,086,925 B2 | 12/2011 | Gass et al. | |
| 8,127,191 B2 * | 2/2012 | Maki | G11C 29/12015 324/750.3 |
| 8,438,442 B2 | 5/2013 | Morrison | |
| 8,458,543 B2 | 6/2013 | Tung | |
| 9,081,063 B2 * | 7/2015 | Narayanan | G01R 31/3004 |
| 2003/0021152 A1 * | 1/2003 | Le | G11C 16/08 365/185.18 |
| 2009/0228751 A1 * | 9/2009 | Gloekler | G01R 31/318547 714/728 |
| 2011/0099442 A1 * | 4/2011 | Hales | G01R 31/318533 714/729 |

* cited by examiner

*Primary Examiner* — Phung M Chung
(74) *Attorney, Agent, or Firm* — Charles E. Bergere

(57) ABSTRACT

A controller executes a first LBIST test on a device at a first shift frequency on a plurality of partitions and detects any voltage drop at sense points in each partition during the test. If a voltage drop is detected, then the test is re-run for those partitions that failed the first test. If failures are detected during the re-execution, then a further test at a lower shift frequency is performed. The partitions can be tested sequentially or in parallel and invention has the advantage of reducing the time taken for executing LBIST when the device is booted.

12 Claims, 1 Drawing Sheet

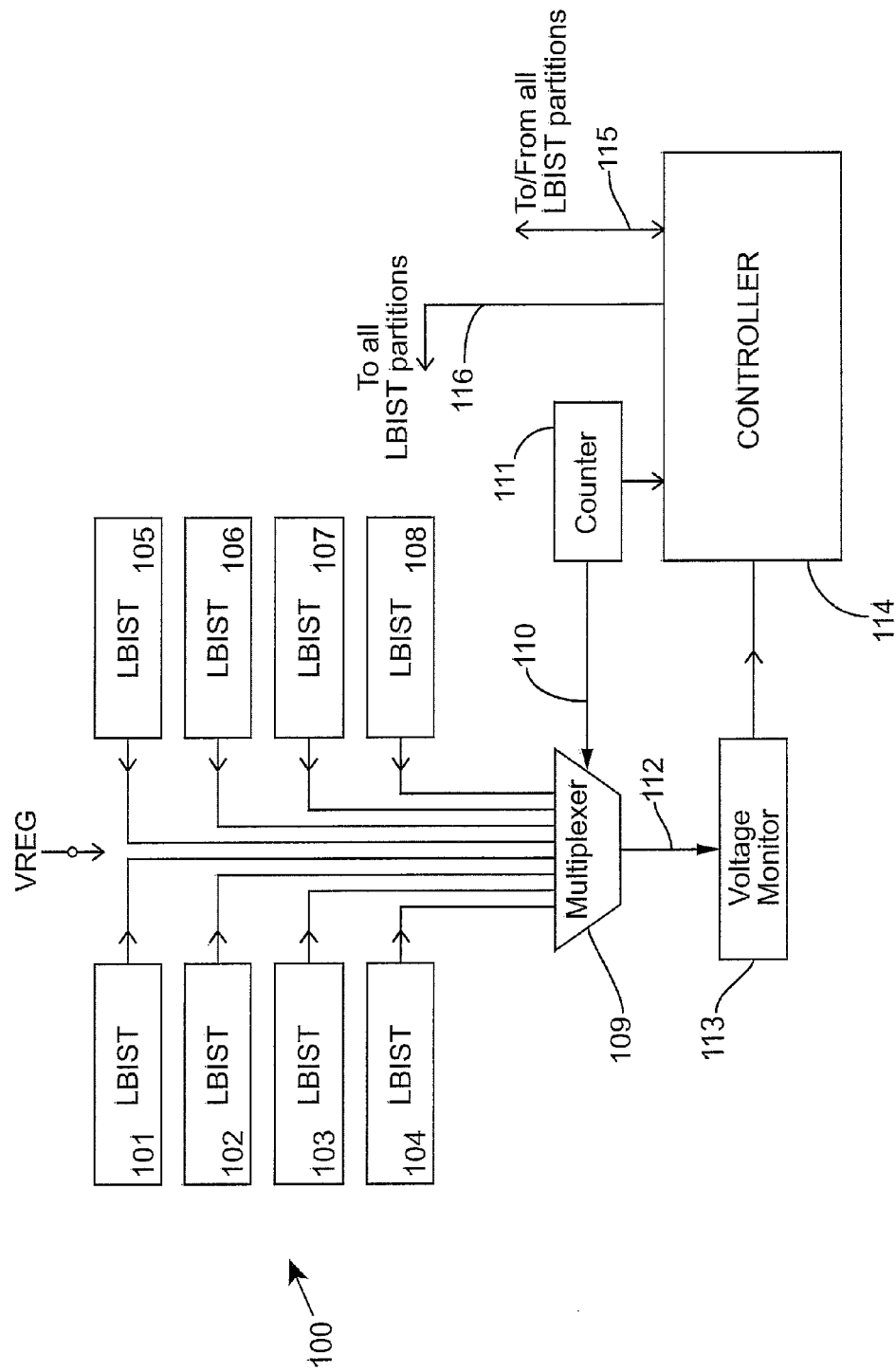

METHOD AND SYSTEM FOR LOGIC BUILT-IN SELF-TEST

BACKGROUND OF THE INVENTION

The present invention relates generally to integrated circuits and testing integrated circuits and, more particularly, to a method and system for testing an integrated circuit using Logic Built-in Self-test (LBIST).

Integrated circuits, such as microprocessors or system-on-chip (SOC) devices typically include a complex matrix of logic gates arranged to perform particular functions. These logic gates are often interconnected in two parallel arrangements, one for operation, and another for testing circuit functionality. Linking a plurality of latches together into a "scan chain" is one known method of arranging logic gates for testing. Such scan chains may be used to gain access to internal nodes of the integrated circuit. Test patterns are shifted in by the scan chains and functional clock signals are pulsed to test the circuit during a capture cycle. The results are then shifted to output pins and compared against expected results. This test cycle is typically repeated many times, which, given the size of integrated circuits today, makes scan test time consuming.

One known method for generating test data for application to the scan chains is LBIST (Logic Built-In Self-Test), which is widely used to detect certain manufacturing defects. LBIST is also a useful tool for studying hardware power and frequency characteristics. However, the electrical power generated during a full-chip LBIST scan can become unreasonably high, sometimes exceeding tolerable levels. Shift speeds and therefore LBIST run time are limited by the current consumption of the device under test. Another problem associated with LBIST testing, particularly at start-up, is the creation of a large voltage drop, which can lead to failures.

Thus it would be advantageous to provide a built-in self-testing system that mitigates these disadvantageous effects.

BRIEF DESCRIPTION OF THE DRAWINGS

The invention, together with objects and advantages thereof, may best be understood by reference to the following description of preferred embodiments together with the accompanying drawings in which:

FIG. 1 is a schematic block diagram of a system for performing Logic Built-in Self-Test (LBIST) in accordance with an embodiment of the invention.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides an integrated circuit that is testable using logic built-in self-test (LBIST). The integrated circuit (IC) comprises a plurality of partitions that are testable using LBIST, a controller operably coupled to each of the plurality of partitions, and a voltage monitoring circuit. The voltage monitoring circuit is operably coupled to the controller and to each of the partitions and compares a voltage value of a supply voltage of each partition with a reference voltage value and generates a trigger signal depending on the comparison result. The controller is arranged to execute a first LBIST test on at least some of the partitions and to detect a partition failing the first test, and if a trigger signal is received at the controller from the voltage monitor circuit during the first test, to execute a second LBIST test on the partitions that failed the first test.

In another embodiment, the present invention provides a method for LBIST, the method comprising: running a first LBIST test on a plurality of partitions of an integrated circuit; performing a comparison between a voltage value of a supply voltage in each of the partitions undergoing the first test and a reference voltage value and generating a trigger signal depending on the comparison result; detecting a partition failing the first test; and if a trigger signal is generated during the first test, running a second LBIST test on the partitions that failed the first test.

In one example, the controller is arranged to run the first LBIST test at a first frequency on each LBIST partition sequentially, and to run the second LBIST test at the first frequency on the partitions that failed the first test, and to run a third test at a second frequency that is lower than the first frequency on the LBIST partitions that fail the second test.

In another example, the controller is arranged to run the first LBIST test on the partitions in parallel and to run the second LBIST test on the partitions, in parallel, that failed the first LBIST test, and to run a third LBIST test on the partitions in parallel that fail the second test.

Advantageously, the invention can reduce the time taken to perform LBIST tests at booting of the device.

A typical device can have between two and thirty partitions.

A typical value for the first frequency can be in a range of 60 MHz-80 MHz and a typical value for the second frequency can be in a range of 40 MHz-50 MHz and so on, with the frequency being reduced further for subsequent tests if required. However, these examples are design-specific values and can change depending on various design parameters (such as the technology used, current supply characteristics, etc.)

Referring now to FIG. 1, a schematic block diagram of portions of an integrated circuit (IC) 100 that is at least partially testable using LBIST is shown. The IC 100 includes a plurality of LBIST partitions 101-108, each of which contains conventional scan chains, clock and trigger circuitry (not shown). While eight partitions are shown in FIG. 1, the invention may be realized with fewer or more partitions. A regulated voltage supply VREG is provided for supplying the LBIST partitions with a regulated voltage. A multiplexer 109 receives an output signal from each of the LBIST partitions 101-108. The output signal from each LBIST partition 101-108 is taken from a particular point of reference (or 'sense' point} in the supply voltage grid of each LBIST partition 101-108 and so has a voltage value. The multiplexer 109 is controlled by a select signal on line 110, which is provided by a counter 111. Thus, a signal appearing on an output line 112 of the multiplexer 109 comprises the LBIST partitions' signal outputs in a time multiplexed fashion.

The output of the multiplexer 109 is fed to a voltage monitor 113, which compares the voltage value of each LBIST partition's output signal with an expected voltage value. The voltage monitor 113 generates an output signal that is fed to an LBIST controller 114. The LBIST controller 114 also receives a signal from the counter 111. The output signal from the voltage monitor 113 is indicative of whether the voltage level of an output signal from an LBIST partition 101-108 is equal to the expected voltage value. In one embodiment, the voltage monitor 113 comprises low voltage detector circuitry.

The LBIST controller 114 is operably coupled to each of the partition 101-108. Just one input/output line annotated 115 is shown for the sake of clarity and represents a two-way flow of signals between the controller 114 and each partition 101-108. One function of the LBIST controller 114 is to start and program the LBIST partitions 101-108 as per a given configuration. Typically this is done via software or by downloading from an "on-chip" non-volatile memory (not shown). The LBIST controller 114 enables LBIST tests to be executed and controls the scanning of test bit patterns into and out of the LBIST partitions 101-108 and detects a resulting pass or fail condition in respect of each partition 101-108. The LBIST controller 114 also controls the scanning rate (and on-board clocks (not shown) in the LBIST partitions) of an LBIST test executed via control outputs. Just one scan rate control line annotated 116 is shown for the sake of clarity and represents a connection to all of the partitions 101-108. The LBIST controller 114 modifies the test run procedure and scanning rate depending on signals received from the voltage monitor 113 in respect of the individual LBIST partitions 101-108.

In an alternative embodiment, instead of using one voltage monitor 113 with the multiplexer 109 and counter 111 arrangement of FIG. 1, one dedicated voltage monitor for each LBIST partition is employed for monitoring in parallel the output signals from each LBIST partition 101-108.

In a first method of operation, an LBIST test is run or executed on each LBIST partition 101-108 in sequence (sequentially). In this first method, a first LBIST test is run in the fastest possible mode that the circuit design allows and not limited by run current. That is, the LBIST controller 114 triggers an LBIST test to be run and sets the clock frequency of the scan chains at a first (high) frequency. Leakage current in an LBIST partition 101-108 will typically vary depending upon PVT (process, voltage temperature) conditions. If, during the first LBIST test, the total current generated is greater than the voltage supply VREG can support, then the voltage monitor 113 generates a trigger signal. The trigger signal generated by the voltage monitor 113 is detected and recorded by the LBIST controller 114 while the test is running. The LBIST controller 114 also records which LBIST partition(s) caused generation of the trigger signal. The LBIST controller 114 also detects a 'pass' or 'fail' condition for each LBIST partition 101-108 during this sequential test run. If, for a particular partition (or partitions), the trigger signal is active and that particular partition(s) fails the (first) test, the controller 114 initiates a second LBIST test for the particular LBIST partition (or partitions) that failed. This second test is carried out at the same (high) scanning frequency. The remaining LBIST partitions that passed the first LBIST test are not tested again (to improve test time). If the second LBIST test also fails for the one or more partitions being re-tested, then the controller 114 re-triggers the test to run at lower scan-in (shift) frequency as a third LBIST test for those partitions that have failed the second LBIST test. The third LBIST test at a lower frequency is performed only on the partitions that were recorded as having failed the second LBIST test. The lower frequency can be provided using clock dividers (not shown) provided in the controller 114. Only a detected failure condition after the third LBIST test will be recorded as a "true" fail by the controller 114. Capture clock frequency is not modified. Reducing the scan frequency reduces the current requirement. If at any time during a test run the voltage monitor is not triggered but a partition is detected to fail, then this is considered to be a true fail (i.e., not a failure that may be attributed to the speed at which the test was executed).

In a modification to the first method, the scan frequency is reduced a second time in a fourth LBIST test for the LBIST partitions that fail the third LBIST test and so on, if necessary.

In a further modification to the first method, rather than waiting for completion of the first LBIST test before deciding if a re-run is necessary, as soon as the voltage monitor 113 is triggered (i.e., generates the trigger signal), the controller 114 stops the clock (not shown) used to scan (or shift) the scan bit pattern into the particular partition that caused the voltage monitor to trigger. Then the second LBIST test is commenced for that particular partition.

In a second method of operation, a first LBIST test is run on all of the partitions 101-108 in parallel or on a sub-set of the partitions. By varying the number of partitions running at the same time, control of the dynamic current can be achieved. This second method requires the use of multiple voltage monitors, one for each partition 101-108. The number of LBIST partitions that can be tested in parallel will be limited by a maximum dynamic portion of the available current. However, this second method uses the leakage portion of the total current consumption, which will depend upon PVT conditions. As in the first method, while a first LBIST test is being run, if the total current is more than the voltage supply VREG can support, the voltage monitor 113 will generate the trigger signal. The trigger signal(s) are detected and recorded by the LBIST controller 114.

If, for a particular partition (or partitions), the voltage monitor 113 has been triggered (has generated the trigger signal) and that particular partition(s) fails the (first) test, the controller 114 re-runs (re-triggers) the LBIST test in a second LBIST test run in parallel for the particular LBIST partition (or partitions) which failed. This second test is carried out at the same scanning frequency. The remaining LBIST partitions which passed are not tested again. If the second LBIST test run also fails for the one or more partitions which are being re-tested, then the controller 114 repeats the test for the failing partitions. The test can be repeated again until all partitions are either passing or any of the partitions fail individually. Triggering of a voltage monitor indicates that the LBIST partition failed because of dynamic current exceeding the limits and there may not be an actual issue or fault in the device under test.

The connections as discussed herein may be any type of connection suitable to transfer signals from or to the respective nodes, units or modules, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner.

Likewise, single connections carrying multiple signals may be separated out into various different connections carrying subsets of these signals. Therefore, many options exist for transferring signals.

Those skilled in the art will recognize that the boundaries between logic blocks and modules are merely illustrative and that alternative embodiments may merge logic blocks or circuit elements or impose an alternate decomposition of functionality upon various logic blocks, modules or circuit elements. Thus, it is to be understood that the architectures depicted herein are merely exemplary, and that in fact many other architectures can be implemented that achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the modules may be implemented in an integrated circuit. Such an integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the modules and which are connectable to other components outside the package through suitable connections such as pins of the package and bond wires between the pins and the dies.

Also for example, the examples, or portions thereof, may implemented as soft or code representations of physical circuitry or of logical representations convertible into physical circuitry, such as in a hardware description language of any appropriate type.

Also the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems.'

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An integrated circuit, comprising:
    a plurality of partitions testable using Logic Built-in Self Test (LBIST);
    a controller operably coupled to each of the partitions; and
    at least one voltage monitor, operably coupled to the controller and to each partition, for comparing a voltage value of a supply voltage of each partition with a reference voltage value and generating a trigger signal depending on the comparison,
    wherein the controller is arranged to execute a first LBIST test on at least some of the partitions and to detect a partition failing the first LBIST test, and if a trigger signal is received at the controller from the at least one voltage monitor during the first LBIST test, to execute a second LBIST test on the partitions that failed the first test.

2. The integrated circuit of claim 1, wherein the voltage values of the supply voltages of each of the partitions are obtained from sense points in a supply voltage grid of each partition.

3. The integrated circuit of claim 1, wherein the at least one voltage monitor comprises low voltage detection circuitry.

4. The integrated circuit of claim 1, wherein the controller is arranged to program all of the partitions in a given configuration prior to executing the first LBIST test.

5. The integrated circuit of claim 1, wherein the controller is arranged to run the first LBIST test at a first frequency on the partitions sequentially, and to run the second LBIST test at the first frequency on the partitions that failed the first LBIST test, and to run a third LBIST test at a second frequency that is lower than the first frequency on the partitions that fail the second LBIST test.

6. The integrated circuit of claim 5, wherein the at least one voltage monitor comprises a single voltage monitor, the integrated circuit further comprising a multiplexer, connected between the plurality of partitions and the single voltage monitor, for relaying voltage values of a supply voltage in each partition to the voltage monitor in a time-multiplexed fashion.

7. The integrated circuit of claim 1, wherein the controller is arranged to run the first LBIST test on the at least some of the partitions in parallel, and to run the second LBIST test on the partitions, in parallel, that failed the first LBIST test, and to run a third LBIST test on the partitions, in parallel, that fail the second LBIST test.

8. The integrated circuit of claim 7, wherein the at least one voltage monitor comprises a plurality of voltage monitors, wherein each of the voltage monitors receives a voltage value of a supply voltage from one of the plurality of partitions for monitoring the voltage values in parallel.

9. A method for testing an integrated circuit using Logic Built-in Self-test (LBIST), wherein the integrated circuit includes a plurality of partitions and an LBIST controller, the method comprising:
    executing a first LBIST test on at least some of the partitions;
    comparing a voltage value of a supply voltage in each of the partitions undergoing the first LBIST test with a reference voltage value, by the LBIST controller;
    generating a trigger signal, by the LBIST controller, depending on the comparison;

detecting, by the LBIST controller, a partition failing the first LBIST test; and if a trigger signal was generated during the first LBIST test, then executing a second LBIST test on the partitions that failed the first LBIST test.

10. The method of claim 9, further comprising programming all of the partitions in a given configuration prior to executing the first LBIST test.

11. The method of claim 9, further comprising:

executing the first LBIST test at a first frequency on each partition sequentially;

if a trigger signal was generated, then executing the second LBIST test at the first frequency on the partitions that failed the first LBIST test;

detecting a partition failing the second LBIST test; and executing a third LBIST test at a second frequency that is lower than the first frequency on the LBIST partitions that failed the second test.

12. The method of claim 9, further comprising:

executing the first LBIST test, in parallel, on the at least some of the partitions;

if a trigger signal is generated during the first LBIST test, then executing the second LBIST test, in parallel, on the partitions that failed the first test;

detecting a partition failing the second LBIST test; and executing a third LBIST test, in parallel, on the partitions that failed the second LBIST test.

\* \* \* \* \*